US009461350B2

(12) United States Patent
Martius et al.

(10) Patent No.: US 9,461,350 B2
(45) Date of Patent: Oct. 4, 2016

(54) COAXIAL CABLE ARRANGEMENT WITH A STANDING WAVE TRAP COMPRISED OF AN ADJUSTABLE DIELECTRIC RESONATOR DEVICE

(71) Applicants: Sebastian Martius, Forchheim (DE); Wolfgang Renz, Erlangen (DE)

(72) Inventors: Sebastian Martius, Forchheim (DE); Wolfgang Renz, Erlangen (DE)

(73) Assignee: Siemens Aktiengesellschaft, München (DE)

( * ) Notice: Subject to any disclaimer, the term of this patent is extended or adjusted under 35 U.S.C. 154(b) by 0 days.

(21) Appl. No.: 14/170,561

(22) Filed: Jan. 31, 2014

(65) Prior Publication Data
US 2014/0218134 A1   Aug. 7, 2014

(30) Foreign Application Priority Data
Feb. 1, 2013   (DE) .................... 10 2013 201 685

(51) Int. Cl.
H01P 1/202   (2006.01)
H01P 1/208   (2006.01)
H04B 15/00   (2006.01)
G01R 33/36   (2006.01)

(52) U.S. Cl.
CPC .......... H01P 1/202 (2013.01); G01R 33/3685 (2013.01); H01P 1/2084 (2013.01); H04B 15/00 (2013.01)

(58) Field of Classification Search
CPC ..... H01P 1/2084; H01P 1/2086; H01P 1/202
USPC ......................... 333/206, 202, 12
See application file for complete search history.

(56) References Cited

U.S. PATENT DOCUMENTS

| 4,184,130 | A | * | 1/1980 | Nishikawa et al. | .......... 333/206 |
| 4,757,288 | A | * | 7/1988 | West | .............. 333/206 |
| 4,862,122 | A | * | 8/1989 | Blair et al. | .................... 333/202 |
| 5,294,886 | A | | 3/1994 | Duerr | |
| 6,822,846 | B2 | | 11/2004 | Reykowski | |
| 7,095,300 | B2 | * | 8/2006 | Andoh | .......... 333/206 |
| 7,608,778 | B2 | | 10/2009 | Reykowski | |
| 2007/0201178 | A1 | | 8/2007 | Reykowski | |
| 2008/0139044 | A1 | | 6/2008 | Hantsch et al. | |
| 2009/0021261 | A1 | | 1/2009 | Chmielewski et al. | |
| 2009/0315642 | A1 | | 12/2009 | Evers et al. | |

(Continued)

FOREIGN PATENT DOCUMENTS

CN   1214151 A   4/1999
CN   1910468 A   2/2007

(Continued)

OTHER PUBLICATIONS

German Office Action dated Jul. 22, 2013 in corresponding German Patent Application No. DE 10 2012 201 685.9 with English translation.

(Continued)

Primary Examiner — Benny Lee
(74) Attorney, Agent, or Firm — Lempia Summerfield Katz LLC

(57) ABSTRACT

A conductor arrangement includes a conductor that extends along a conductor axis. The conductor arrangement also includes a standing wave trap to which the conductor is coupled in order to damp standing waves that are excited by an RF field from outside the conductor arrangement. The standing wave trap is in the form of a dielectric resonator device.

18 Claims, 2 Drawing Sheets

(56) References Cited

U.S. PATENT DOCUMENTS

2011/0267051 A1  11/2011  Eberler et al.
2013/0181716 A1   7/2013  Greim

FOREIGN PATENT DOCUMENTS

| CN | 101029922 A   | 9/2007  |
| CN | 101099261 A   | 1/2008  |
| CN | 102111602 A   | 6/2011  |
| DE | 19627027 C1   | 6/1997  |
| DE | 10211535      | 10/2003 |
| DE | 102006009040  | 9/2007  |
| DE | 202008015239  | 5/2010  |
| DE | 102010018856  | 11/2011 |
| DE | 102011079596  | 1/2013  |
| JP | H09331202 A   | 12/1997 |
| WO | WO9727642 A1  | 7/1997  |
| WO | 2010057564    | 5/2010  |

OTHER PUBLICATIONS

Korean Office action for related Korean Application No. 10-2014-0010634, dated Jun. 22, 2015, with English Translation.
Chinese Office action for related Chinese Application No. 2014100251531 dated Oct. 8, 2015, with English Translation.
Chinese Search Report for Chinese Patent Application No. 201410025153.1, dated Apr. 22, 2016, with English Translation.

\* cited by examiner

COAXIAL CABLE ARRANGEMENT WITH A STANDING WAVE TRAP COMPRISED OF AN ADJUSTABLE DIELECTRIC RESONATOR DEVICE

This application claims the benefit of DE 10 2013 201 685.9, filed on Feb. 1, 2013, which is hereby incorporated by reference in its entirety.

BACKGROUND

The present embodiments relate to a conductor arrangement.

Standing wave traps are elements provided in magnetic resonance systems for providing reliable and interference-free operation of radio-frequency coils and other radiofrequency elements. Partially metallic, mechanically expanded structures that use electrically conductive contact to the conductor on which standing waves are intended to be damped may be used in order to produce standing wave traps. However, metallic structures tend to be problematical in magnetic resonance systems since gradient-induced eddy currents may form in the metallic structures.

DE 102 11 535 A1 (corresponding to U.S. Pat. No. 6,822,846 B2) and DE 10 2006 009 040 A1 (corresponding to U.S. Pat. No. 7,608,778 B2) disclose standing wave traps in which an electrically conductive contact to the conductor is not required. However, the standing wave traps also include metallic structures.

Dielectric resonators that may be produced in the form of ceramic cylinders are known from microwave technology.

SUMMARY AND DESCRIPTION

The scope of the present invention is defined solely by the appended claims and is not affected to any degree by the statements within this summary.

The present embodiments may obviate one or more of the drawbacks or limitations in the related art. For example, a conductor arrangement with a standing wave trap without metallic structures may be produced.

According to one or more of the present embodiments, the conductor arrangement is formed such that the standing wave trap is in the form of a dielectric resonator device.

In one embodiment, the dielectric resonator device is in the form of a closed structure around the conductor axis as seen in cross-section to the conductor axis. In this embodiment, a standing wave that is induced on the conductor couples to the E010 mode of the dielectric resonator device.

In an alternative embodiment, the dielectric resonator device extends over a conductor-related coverage angle of a maximum of 180°, as seen in cross-section to the conductor axis. In this embodiment, a standing wave that is induced on the conductor couples to the H011 mode of the dielectric resonator device. Coupling to the H011 mode is good when the conductor extends a device-related coverage angle of at least 180° (e.g., at least 360°) around the dielectric resonator device.

Tuning standing wave traps may be problematic. In order to allow the standing wave trap of the conductor arrangement according to one or more of the present embodiments to be tuned in a simple manner, the dielectric resonator device may have at least two dielectric resonator elements that are coupled to one another. In this case, in order to tune the dielectric resonator device to a frequency of the RF field, the arrangement of the dielectric resonator elements relative to one another (and therefore the degree of coupling) may be adjusted.

The way in which the arrangement of the dielectric resonator elements relative to one another is adjusted may be determined as required. For example, lateral displacement of the dielectric resonator elements relative to one another may be adjusted. As an alternative or in addition, a rotary position of the dielectric resonator elements relative to one another may be adjusted. As an alternative or in addition, a distance of the dielectric resonator elements from one another may be adjusted.

In one embodiment, one of the dielectric resonator elements may be positioned, using a thread that has a thread axis, axially along the thread axis by being turned about the thread axis. In this case, the distance of the dielectric resonator elements from one another depends on the axial positioning of the one dielectric resonator element along the thread axis. In this way, highly accurate tuning of the dielectric resonator device may be achieved in a simple manner.

The conductor of the conductor arrangement may be configured, as required. The conductor may be in the form of a shield of a coaxial cable that has at least one internal conductor.

DETAILED DESCRIPTION

Figure 1:
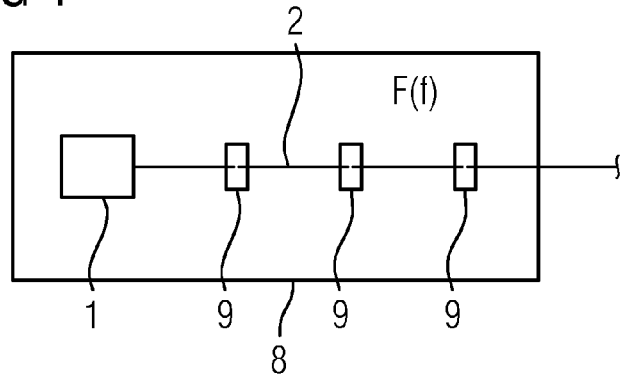
FIG. 1 shows one embodiment of a magnetic resonance system having a conductor arrangement.
Figure 2:
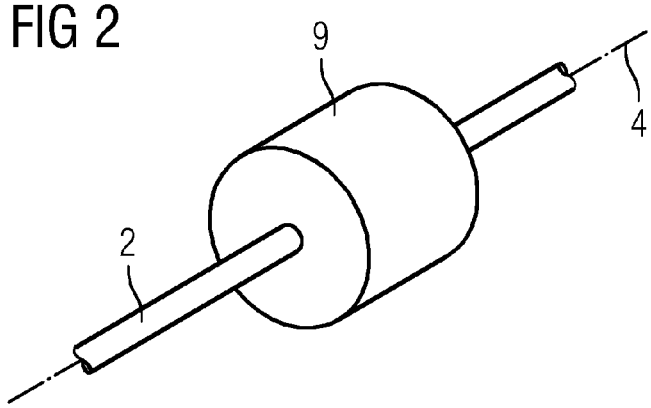
FIG. 2 shows a perspective illustration of one embodiment of a conductor arrangement.
Figure 3:
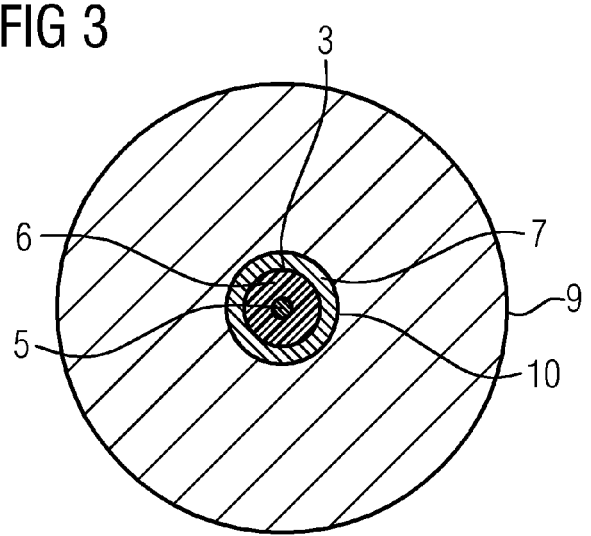
FIG. 3 shows a cross section through the conductor arrangement of FIG. 2.
Figure 4:
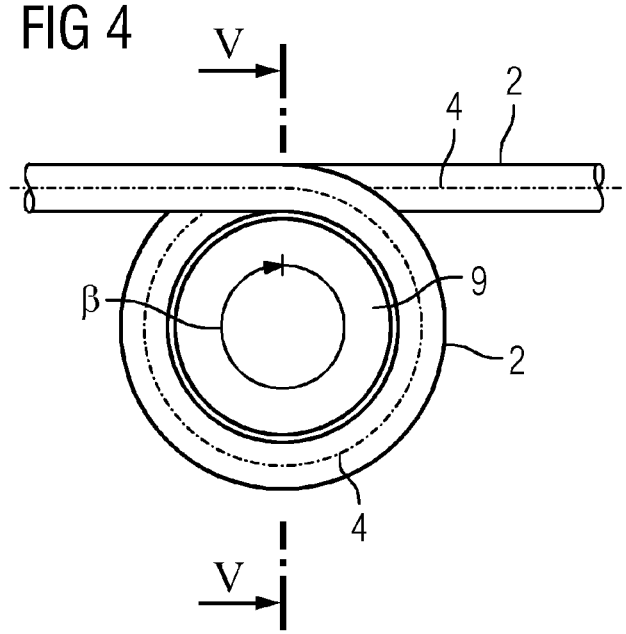
FIG. 4 shows a side view of one embodiment of a conductor arrangement.
Figure 5:
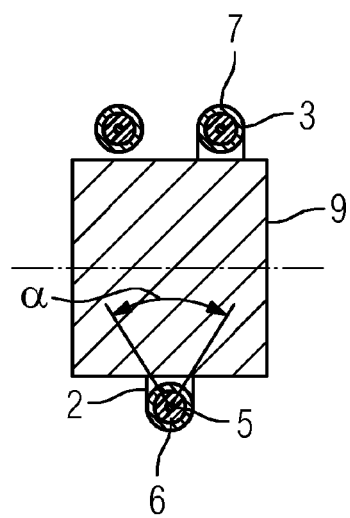
FIG. 5 shows a section through one embodiment of the conductor arrangement of FIG. 4.

According to FIG. 1, an element 1 of a magnetic resonance system (e.g., a local coil) is connected to another device (not illustrated in FIG. 1) via a cable 2 (FIGS. 2, 4, 5). According to FIGS. 2 to 5, the cable 2 has a conductor 3 (FIGS. 3,5) that extends along a conductor axis 4 (FIGS. 2,4). According to FIG. 1, the cable 2 is in the form of a coaxial cable. The coaxial cable 2 has an internal conductor 5 (FIGS. 3,5). The conductor 3 is in the form of a shield of the coaxial cable 2. An insulation 6 (FIGS. 3,5) is arranged between the internal conductor 5 and the conductor 3. A cable sheath 7 (FIGS. 3,5) is arranged around the outside of the shield 3. This refinement, in which the cable 2 is in the form of a coaxial cable, constitutes the general case. However, in individual cases, the conductor 3 may be a "normal" conductor that is surrounded only by a cable sheath 7 or only by a core insulation.

The conductor 3 is exposed to an RF field F (FIG. 1) from the outside (e.g., to the excitation field of a whole-body transmission antenna 8 (FIG. 1) of the magnetic resonance system). The RF field F has a frequency f (FIG. 1). Without further measures, the RF field F would excite a standing wave in the conductor 3. A standing wave trap 9 (FIGS. 1-5)

is provided in addition to the conductor 3 in order to damp standing waves of this kind. The conductor 3 is coupled to the standing wave trap 9.

Different designs may be provided for configuring the standing wave trap 9. According to one or more of the present embodiments, the standing wave trap 9 is in the form of a dielectric resonator device. The dielectric resonator device may be composed, for example, of a ceramic material. Possible configurations according to embodiments of the standing wave trap 9 are explained in greater detail below in conjunction with the further figures.

According to FIGS. 2 and 3, the dielectric resonator device 9 is in the form of a closed structure as seen tangentially around the conductor axis 4. By way of example, the dielectric resonator device 9 may be in the form of a cylinder or in the form of another rotationally symmetrical structure. The resonator device 9 has a central recess 10 (FIG. 3) through which the cable 2 is routed.

As an alternative, the dielectric resonator device 9, according to FIGS. 4 and 5, may adjoin only one side of the conductor 3 with respect to the conductor axis 4. In this case, the dielectric resonator device 9 covers a conductor-related coverage angle α (FIG. 5), as seen around the conductor axis 4. The conductor-related coverage angle α is a maximum of 180°.

In one embodiment, the conductor 3 and the dielectric resonator device 9 may adjoin one another only along a substantially straight line. However, the conductor 3 may form a portion of a turn around the dielectric resonator device 9 in the case of the refinement of FIGS. 4 and 5. In one embodiment, the conductor 3 according to the illustration in FIGS. 4 and 5 may form one complete turn or even more than one complete turn (e.g., one and a half turns) about the dielectric resonator device 9. The conductor 3 may form at least half a turn. Accordingly, the conductor 3 may cover a device-related coverage angle β (FIG. 4) of at least 180°, as seen around the dielectric resonator device 9.

Figure 6:
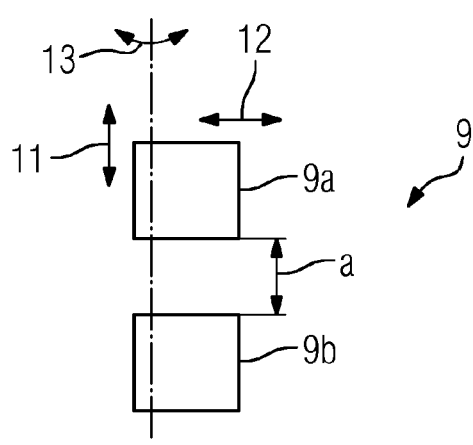
FIG. 6 shows one embodiment of a dielectric resonator device.

In one embodiment, the dielectric resonator device 9 includes a single dielectrically active element. The dielectric resonator device 9 according to FIG. 6 may include at least two dielectric resonator elements 9a, 9b that are coupled to one another. The arrangement of the two dielectric resonator elements 9a, 9b relative to one another may be adjusted. This applies both to the refinement according to FIGS. 2 and 3 and also to the refinement according to FIGS. 4 and 5. As schematically indicated in FIG. 6, a distance a (see double-headed arrow 11), a lateral displacement (see double-headed arrow 12) and/or a rotary position (see double-headed arrow 13) may be adjusted, for example. The rotary position may be adjusted only when the dielectric resonator elements 9a, 9b are not rotationally symmetrical with respect to the axis of rotation, with respect to which the rotary position is adjusted. The degree of coupling may be adjusted by adjusting the arrangement of the two dielectric resonator elements 9a, 9b relative to one another. In this way, the dielectric resonator device 9 may be tuned to the frequency f of the RF field F in FIG. 1.

Figure 7:
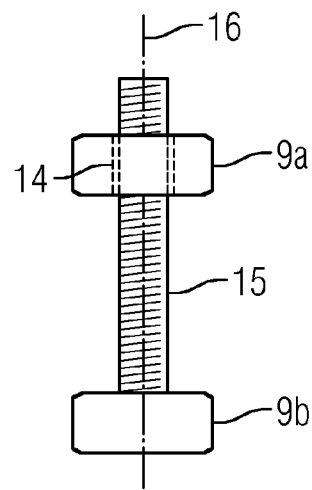
FIG. 7 shows one embodiment of a dielectric resonator device.

In some embodiments, the distance a of the resonator elements 9a, 9b from one another may be adjusted. In such an embodiment, according to FIG. 7, one of the dielectric resonator elements 9a, 9b (e.g., the resonator element 9a) has a thread 14. The thread 14 interacts with a mating thread 15. The thread 14 and the mating thread 15 have a common thread axis 16. By turning the dielectric resonator element 9a around the thread axis 16, the dielectric resonator element 9a may be positioned axially along the thread axis 16. The thread axis 16 may be oriented such that the thread axis 16 is directed toward the other dielectric resonator element 9b. As a result, the distance a (FIG. 6) of the dielectric resonator elements 9a, 9b from one another depends on the axial positioning of the one dielectric resonator element 9a along the thread axis 16.

In one embodiment, the adjustment of the distance a of the dielectric resonator elements 9a, 9b relative to one another by rotating the one dielectric resonator element 9a about the thread axis 16 may be the only way of adjusting the distance a of the dielectric resonator elements 9a, 9b from one another. In this case, the mating thread 15 may be a constituent part of the other dielectric resonator element 9b. As an alternative, the mating thread 15 may be an independent part that is held (e.g., by slight clamping) on the other dielectric resonator element 9b so that the other dielectric resonator element 9b may be displaced by applying a sufficiently large force on the other dielectric resonator element 9b. The distance a may initially be roughly adjusted by displacing the main thread 15. Fine adjustment of the distance a may be performed by turning the one dielectric resonator element 9a.

The present embodiments have many advantages. For example, using the conductor arrangement according to one or more of the present embodiments, a conductor 3 with a standing wave trap 9 may be provided without additional electrically conductive elements being required. Also, an electrically conductive connection of the standing wave trap 9 to the conductor 3 is not required. As a result, the relative position of the standing wave trap 9 may be varied relative to the conductor 3. By way of example, in the refinement according to FIGS. 2 and 3, the standing wave trap 9 may be arranged on the cable 2 in a displaceable manner. In the refinement according to FIGS. 4 and 5, the position in which the cable 2 bears against the standing wave trap 9 may be varied, for example.

Although the invention has been illustrated in greater detail and described in detail by the exemplary embodiments, the invention is not limited by the disclosed examples, and other variations may be derived from this document by a person skilled in the art without departing from the scope of protection of the invention.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A conductor arrangement comprising:
   an internal conductor and an external conductor of a coaxial cable that extends along a conductor axis; and a standing wave trap, to which the external conductor is coupled such that standing waves that are excited by a radio frequency (RF) field from outside the conductor arrangement are damped,
wherein the standing wave trap comprises a dielectric resonator device.

2. The conductor arrangement of claim 1, wherein the dielectric resonator device comprises a closed structure in cross-section around the conductor axis.

3. The conductor arrangement of claim 2, wherein the dielectric resonator device comprises at least two dielectric resonator elements that are coupled to one another, and
wherein in order to tune the dielectric resonator device to a frequency of the RF field, an arrangement of the at least two dielectric resonator elements relative to one another is adjustable.

4. The conductor arrangement of claim 2, wherein the external conductor comprises a shield of a coaxial cable.

5. The conductor arrangement of claim 1, wherein the dielectric resonator device comprises at least two dielectric resonator elements that are coupled to one another, and
wherein in order to tune the dielectric resonator device to a frequency of the RF field, an arrangement of the at least two dielectric resonator elements relative to one another is adjustable.

6. The conductor arrangement of claim 5, wherein the adjustable arrangement comprises a translation of the at least two dielectric resonator elements relative to one another.

7. The conductor arrangement of claim 6, wherein the adjustable arrangement further comprises a rotation of the at least two dielectric resonator elements relative to one another.

8. The conductor arrangement of claim 7, wherein a distance of the at least two dielectric resonator elements from one another is adjustable.

9. The conductor arrangement of claim 7, wherein the external conductor comprises a shield of a coaxial cable.

10. The conductor arrangement of claim 6, wherein a distance of the at least two dielectric resonator elements from one another is adjustable.

11. The conductor arrangement of claim 5, wherein a distance of the at least two dielectric resonator elements from one another is adjustable.

12. The conductor arrangement of claim 11, wherein one of the at least two dielectric resonator elements is positionable, using threading along a thread axis on the one of the at least two dielectric resonator elements, and
wherein the distance of the at least two dielectric resonator elements from one another depends on axial positioning of the one dielectric resonator element along the thread axis.

13. The conductor arrangement of claim 12, wherein the external conductor comprises a shield of a coaxial cable.

14. The conductor arrangement of claim 1, wherein the external conductor extends around the dielectric resonator device at an angle of at least 180°.

15. The conductor arrangement of claim 14, wherein the dielectric resonator device comprises at least two dielectric resonator elements that are coupled to one another, and
wherein in order to tune the dielectric resonator device to a frequency of the RF field, an arrangement of the at least two dielectric resonator elements relative to one another is adjustable.

16. The conductor arrangement of claim 14, wherein the external conductor comprises a shield of a coaxial cable.

17. The conductor arrangement of claim 1, wherein the dielectric resonator device covers the coaxial cable over an angle of a maximum of 180° in cross-section around the conductor axis.

18. The conductor arrangement of claim 1, wherein the external conductor comprises a shield of a coaxial cable.

* * * * *